United States Patent
Postiglione et al.

(10) Patent No.: US 7,519,216 B1
(45) Date of Patent: Apr. 14, 2009

(54) SYSTEMS AND METHODS OF MAINTAINING EQUIPMENT FOR MANUFACTURING SEMICONDUCTOR DEVICES

(75) Inventors: Marc J. Postiglione, New Milford, CT (US); James V. Iannucci, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/112,027

(22) Filed: Apr. 30, 2008

(51) Int. Cl.
*G06K 9/00* (2006.01)
(52) U.S. Cl. ...................... 382/147; 348/126
(58) Field of Classification Search .................. 382/141, 382/145, 147, 149; 348/87, 125, 126; 356/237.1, 356/237.2, 237.3, 237.4, 237.5; 702/121, 702/155, 179
See application file for complete search history.

(56) References Cited

U.S. PATENT DOCUMENTS

| 5,673,208 | A | 9/1997 | Meier et al. |
| 6,968,288 | B2 | 11/2005 | Macaluso et al. |
| 7,228,193 | B2 | 6/2007 | Guldi et al. |
| 2008/0081385 | A1 | 4/2008 | Marella et al. |

*Primary Examiner*—Andrew W Johns
(74) *Attorney, Agent, or Firm*—Jackson Patent Law Office (57) ABSTRACT

Disclosed is a method of operating a manufacturing facility. A processor detects whether abnormal first image data exists at a first common location for each of the last N wafers of the first set of wafers to be placed on a platform, excluding any abnormal image data at a location for wafers that previously had abnormal image data at the location; and detects whether abnormal second image data exists at as second common location for each of the last N wafers of the second set to be placed on the platform, excluding any abnormal image data at a location for wafers that previously had abnormal image data at the location. A decision is made whether to clean the platform depending on results from the processor.

1 Claim, 8 Drawing Sheets

| FIELD LOCATION | WAFER ID |
|---|---|
| ⋮ | |
| 347, 5701 | 23 |
| 402, 189 | 22 |
| 506, 17 | 21, 22, 23 |
| ⋮ | |

SPOT DATA FOR LOT 20

Figure 4

| FIELD LOCATION | WAFER ID |
|---|---|
| ⋮ | |
| 347, 5701 | 23 |
| 402, 189 | 22 |
| 506, 17 | 21, 22, 23 |
| ⋮ | |

SPOT DATA FOR LOT 30

Figure 7

| FIELD LOCATION | WAFER ID |
|---|---|
| 347, 5701 | 23 |
| 402, 189 | 22 |

WAFER DEFECTS FOR LOT 20

Figure 5

| LOT ID | X/Y LOCATION |
|---|---|
| 20 | 506, 17 |

CHUCK DEFECTS

Figure 6

SYSTEMS AND METHODS OF MAINTAINING EQUIPMENT FOR MANUFACTURING SEMICONDUCTOR DEVICES

BACKGROUND OF THE INVENTION

1. Field of the Invention

This invention relates generally to systems and methods of manufacturing and, more particularly, to systems and methods of determining a defect source manifested by localized elevation on the surface topography of a semiconductor substrate.

2. Description of Related Art

As the physical dimensions of semiconductor devices continue to decrease, the topography of the semiconductor substrate upon which the integrated circuit devices are formed becomes an important factor. A semiconductor processing step such as photolithography is used to pattern images in a photoresist on the surface of the substrate. The quality of the images formed on the surface of the substrate by photolithography is related to the topography of the substrate since the topography of the substrate can affect the focus of the photolithographic tool. Localized areas of relatively high elevation can result in defocusing of the patterned images in "hotspots".

Hotspots are typically caused by a defect source such as foreign particulate matter trapped between the substrate and the photolithography aligner chuck upon which the substrate is placed. The foreign particulate matter causes the substrate to bend or deflect resulting in an elevation of a portion of the surface of the substrate above the foreign material. When the elevation deviation is large enough, the imaging surface will be out of focus relative to surrounding images, and imaging failure occurs typically resulting in a nonfunctioning semiconductor device.

When a hotspot is detected, unnecessary maintenance activity may be performed on the chuck when the defect is actually on the incoming substrates.

SUMMARY OF THE INVENTION

To address the problem above, a method comprises receiving a first set of wafers, the first set of wafers being part of a first lot; generating first image data by placing each wafer of the first set on a platform and receiving radiation from the wafer on the platform; receiving a second set of wafers, the second set of wafers being part of a second lot; generating second image data by placing each wafer of the second set on the platform and receiving radiation from the wafer on the platform; detecting whether abnormal first image data exits at a first common location for each of the last N wafers of the first set to be placed on the platform, excluding any abnormal image data at a location for wafers that previously had abnormal image data at the location; detecting whether abnormal second image data exits at a second common location for each of the last N wafers of the second set to be placed on the platform, excluding any abnormal image data at a location for wafers that previously had abnormal image data at the location; and conditionally determining whether to clean the platform, depending on results of the first and second detecting steps.

BRIEF DESCRIPTION OF THE DRAWINGS

References are made to the following text taken in connection with the accompanying drawings, in which.

The accompanying drawings which are incorporated in and which constitute a part of this specification, illustrate embodiments of the invention and, together with the description, explain the principles of the invention, and additional advantages thereof. Certain drawings are not necessarily to scale, and certain features may be shown larger than relative actual size to facilitate a more clear description of those features. Throughout the drawings, corresponding elements are labeled with corresponding reference numbers.

DETAILED DESCRIPTION OF EXEMPLARY EMBODIMENTS

Figure 1:
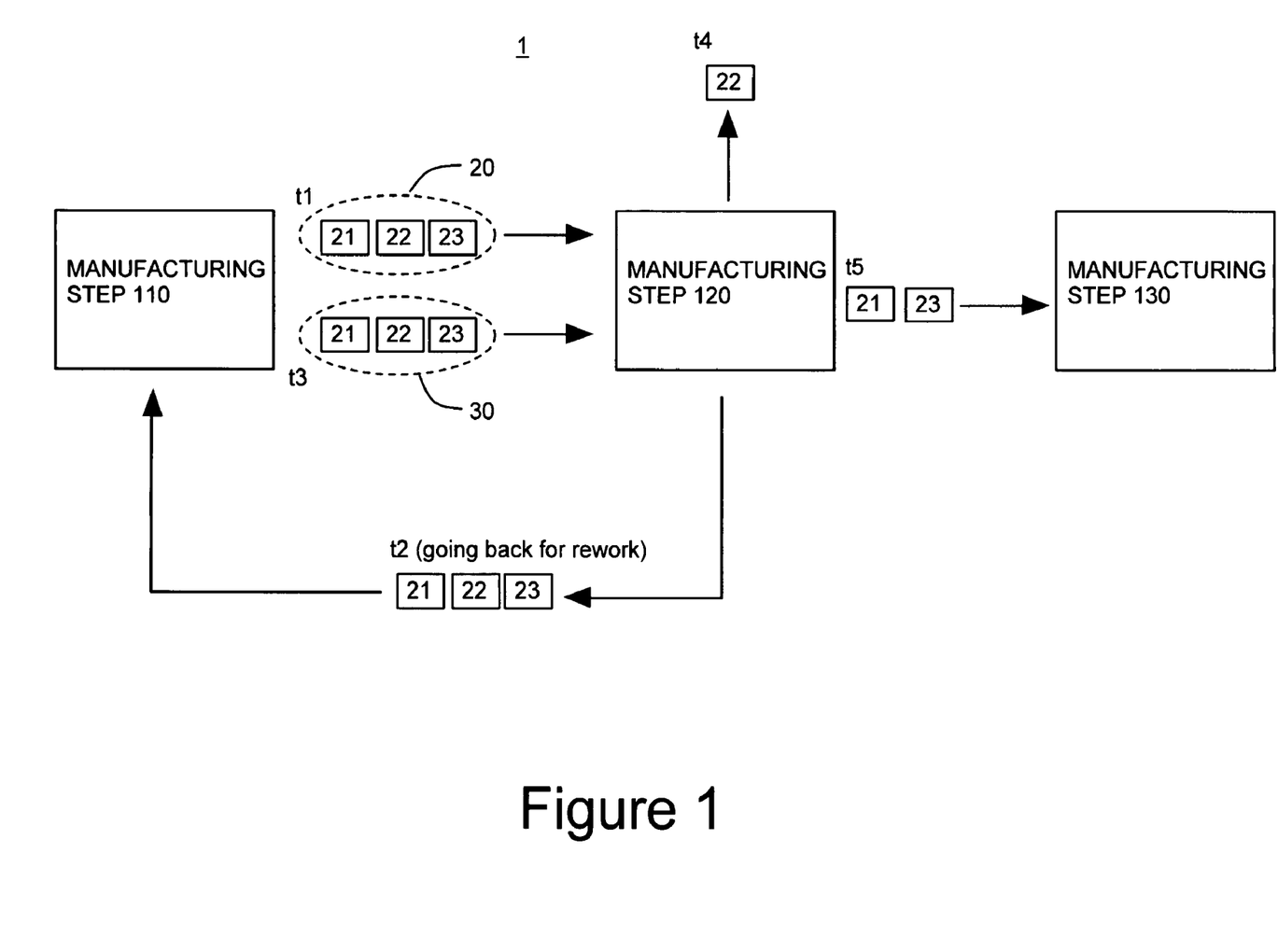
FIG. 1 is a diagram of a manufacturing facility in accordance with an exemplary embodiment of the present invention.

FIG. 1 shows exemplary manufacturing system 1, including people, hardware, data, and computer program instructions to carry out certain functions described below.

Manufacturing system 1 effects step 110 that produces a lot 20 of 18 processed semiconductor wafers, including processed wafers 21, 22, and 23, and sends lot 20 to step 120. Step 120 examines wafers 21, 22, and 23 and selectively sends certain wafers to subsequent manufacturing step 130, and selectively sends other wafers to back to step 110 for rework. Rework includes removing a layer of coating, reapplying coating, and reperforming exposure and developing steps.

Figure 2:
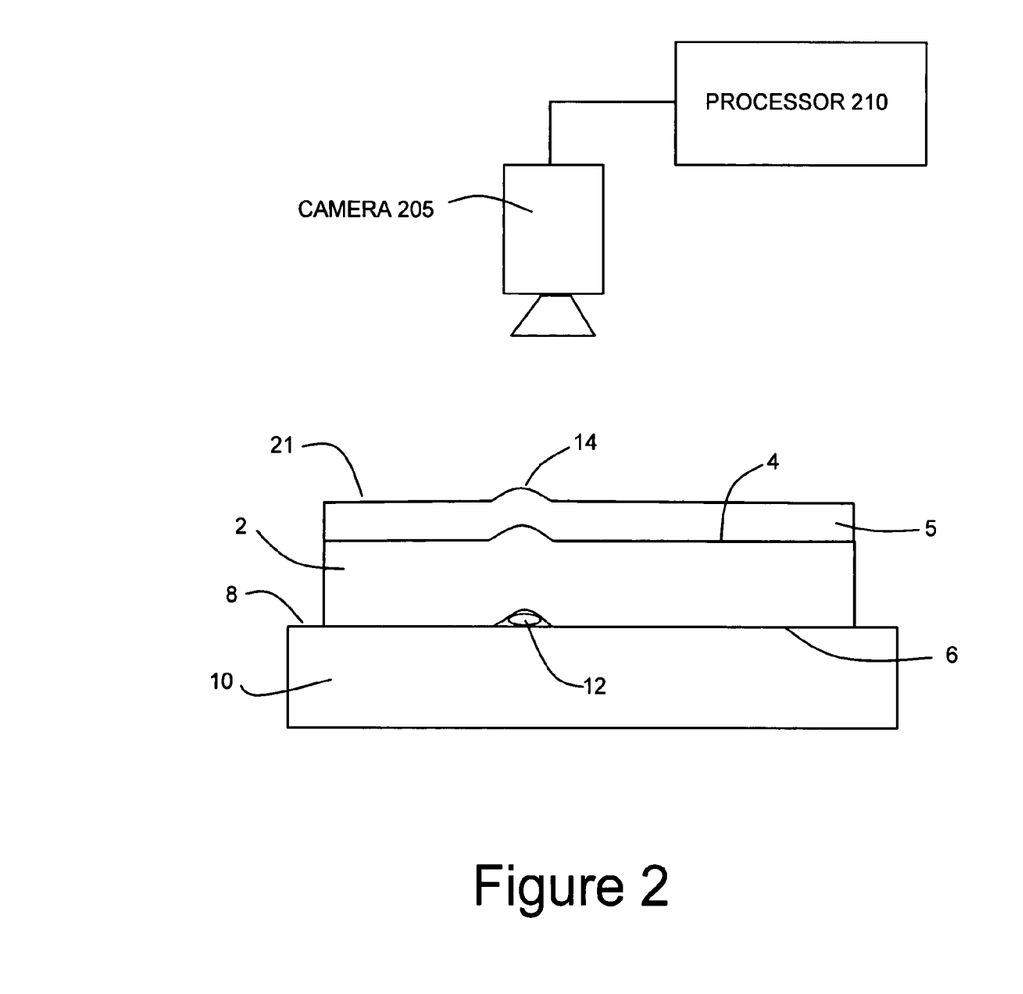
FIG. 2 is a diagram emphasizing an aspect of the facility shown in FIG. 1.
Figure 3A:
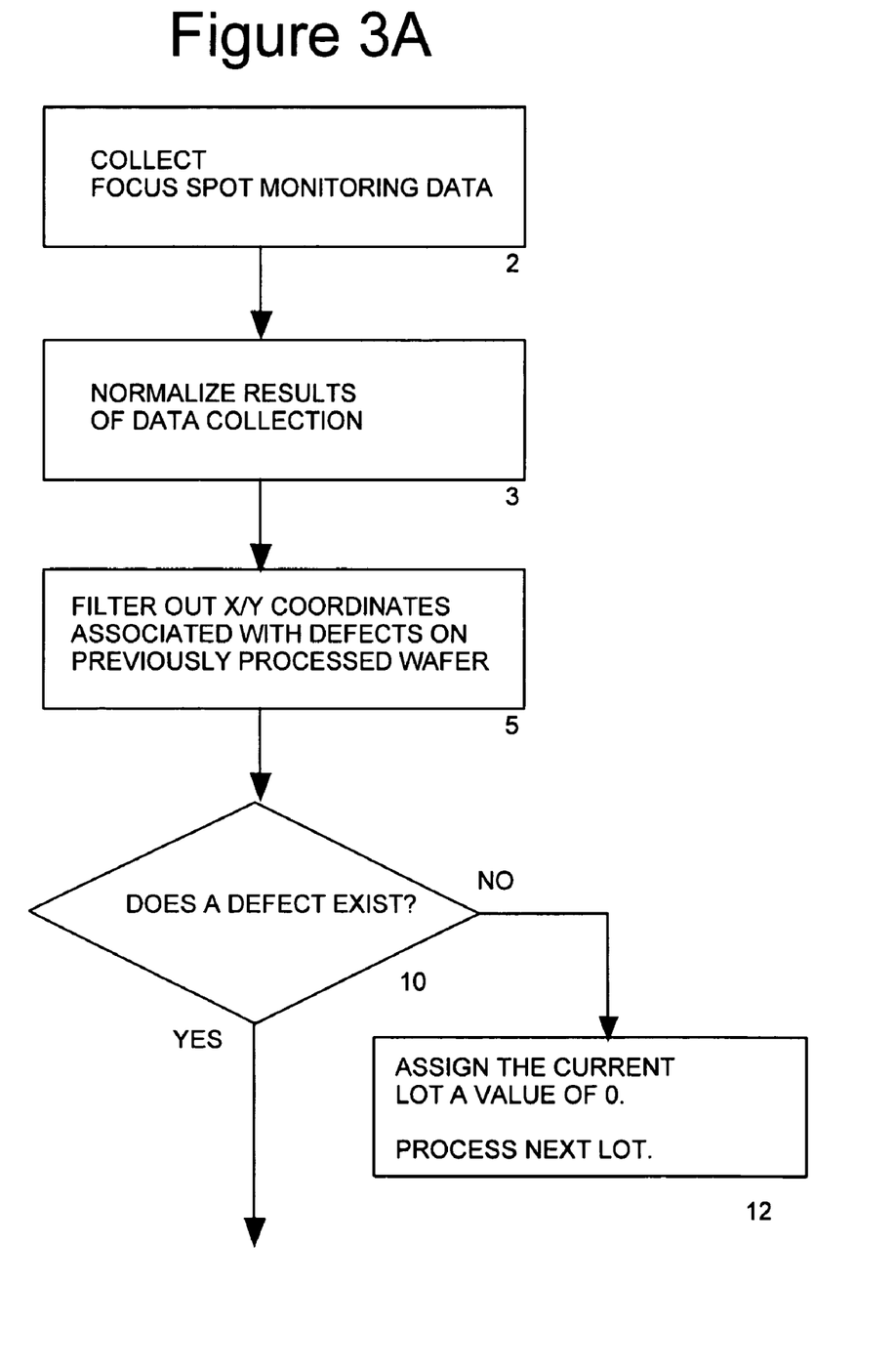
FIGS. 3A, 3B, 3C, and 3D constitute a flowchart of an exemplary process performed in the exemplary facility.
Figure 3B:
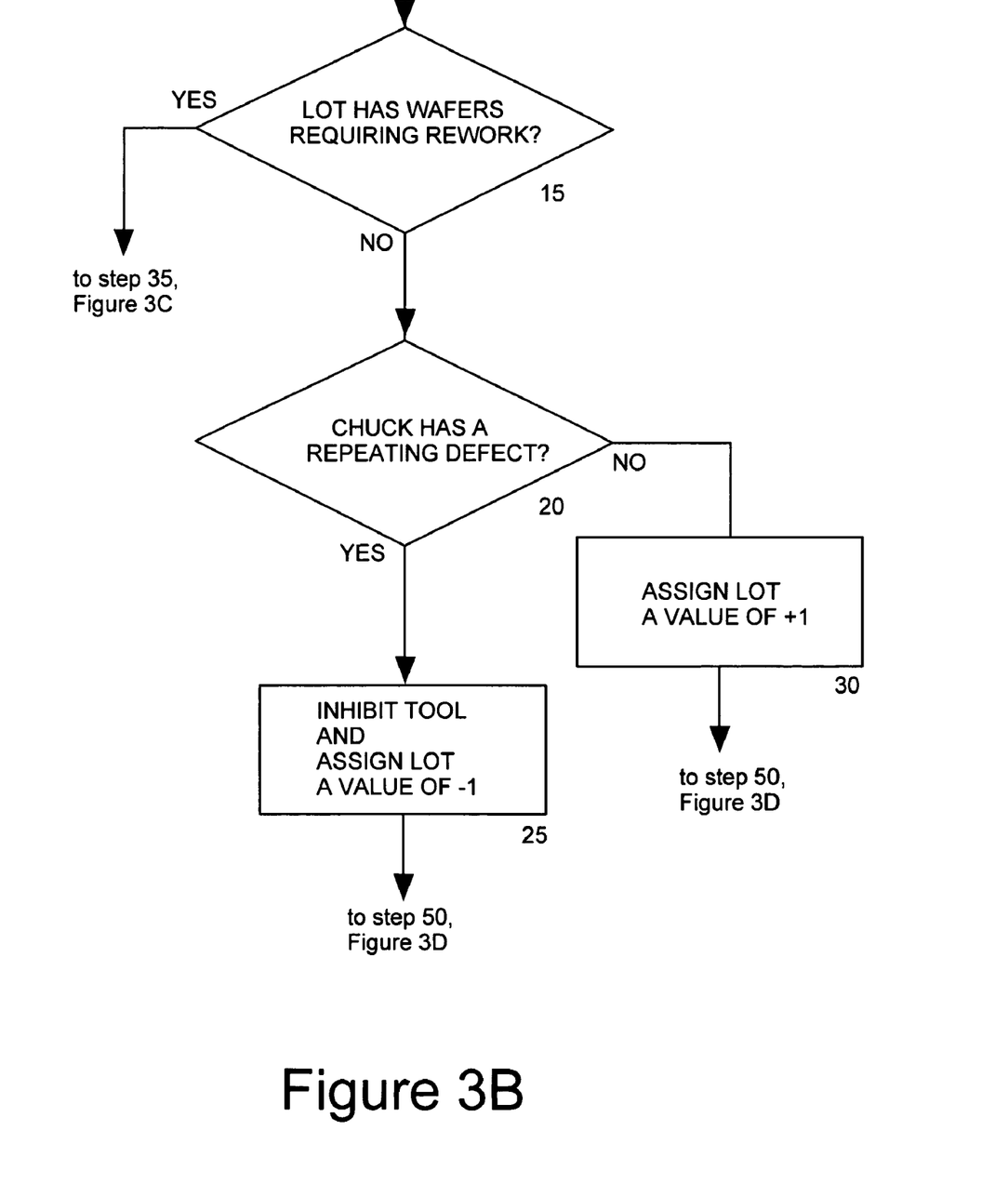
Figure 3C:
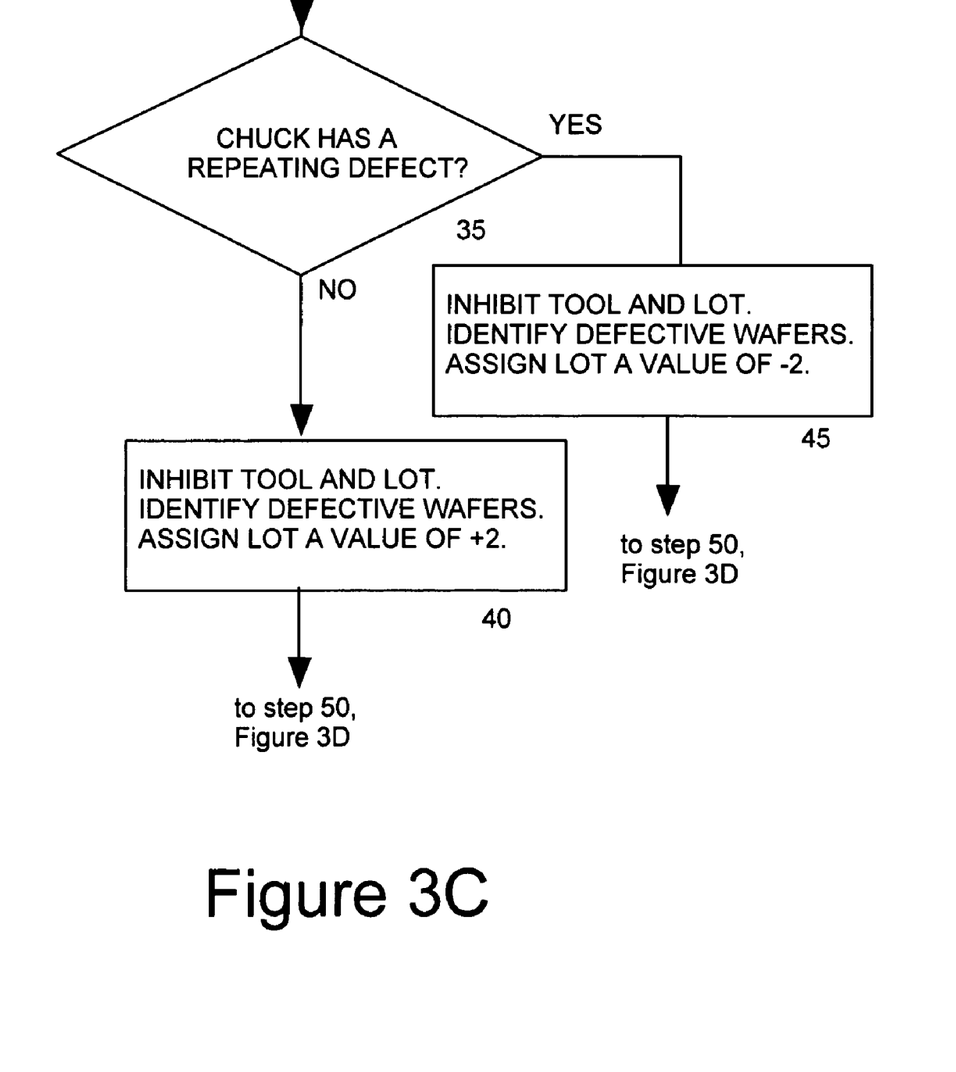
Figure 3D:
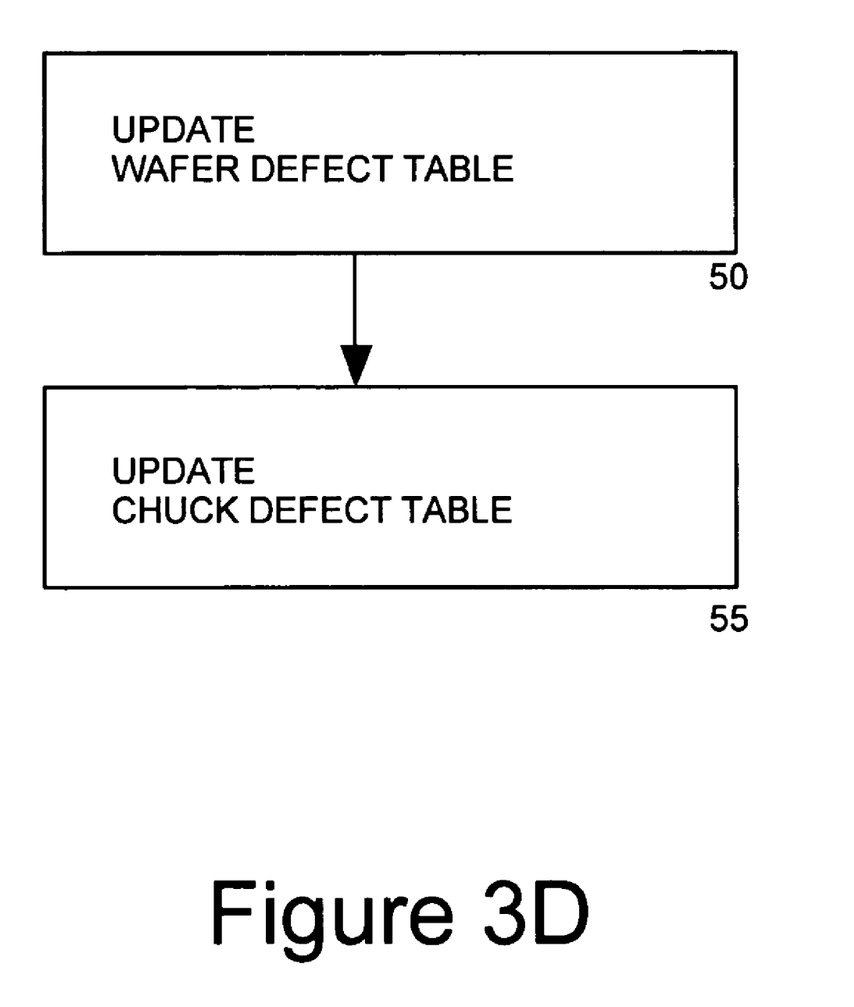

FIG. 2 shows an aspect of manufacturing step 120. Wafer 21 includes substrate 2 having an upper surface 4 upon which a pattern is formed in photoresist layer 5, and a lower surface 6 supported by upper surface 8 of chuck 10. Defect source 12 (in this case, a foreign particulate) is located between lower surface 6 of substrate 2 and upper surface 8 of chuck 10 and creates localized elevation 14 on upper surface 4 of substrate 2. During a photolithographic process, localized elevation 14 results in a hotspot.

Camera 205 and processor 210 generate focus parameter data related to the topography of upper surface 4 of substrate 2 in order to properly pattern an image in resist layer 5 on surface 4.

As described in more detail below, analyzing the focus parameter data across multiple wafers, and multiple lots, provides insight into defect source 12 causing the imaging failure, permitting the original source of the defect to be eliminated. In another embodiment, analyzing the focus parameter data can differentiate between defect source 12 residing on the chuck 10 or an incoming wafer itself, permitting a proper response to the problem.

FIG. 3 shows a subflow of processing performed in manufacturing step 120. Camera 205 collects a respective planar image of the upper surface of each wafer of lot 20. More specifically, the system places a wafer on chuck 10, collects image data from the wafer while it is on chuck 10, removes the wafer, and then places the next wafer on the lot on chuck 10, until the system has collected image data for each wafer of the lot. (step 2).

Processor 210 normalizes the results of step 2, by partitioning the data into radial bands, and then averaging the data within each band, thereby establishing a height baseline for each band. (step 3).

Processor 210 removes defect data at coordinates associated with defects on a previously processed wafer (step 5). Step 5 tends to avoid confusion between a new defect and a previously detected defect.

Processor 210 determines if a defect exists, according to user settable parameters, including spot size and radial limit, spots outside of the radial limit not being considered defects. (step 10).

If the result of step 10 is NO, system 1 assigns the lot a value of 0 and sends all wafers of the lot to the next manufacturing step 130. System 1 then uses chuck 10 to process the next lot, without cleaning chuck 10. (step 12).

If the result of step 10 is YES, processor 210 determines if a defect is of concern, according to user settable parameters, including spot size and radial limit, defects outside of the radial limit not being considered of concern. Another user settable parameter is an allowable percentage of defects on a wafer; a ratio of number of spots/number of fields (step 15).

If the result of step 15 is NO, processor 210 determines if the chuck 10 has a repeating defect, according to user settable chuck limits based on tool type. Chuck limits may include height (based on wavelength), % of defects, and radius. (step 20). A chuck defect exists when each wafer of the current lot manifests an imaging abnormality at a common X/Y coordinate. A repeating chuck defect exists when the chuck has a defect for the current lot and the chuck had a defect for a previous lot, since the last time the chuck was cleaned.

If the result of step 20 is NO, system 1 assigns the lot a value of +1 (step 30), and control passes to step 50.

System 1 updates the wafer defect table for the current lot. A wafer defects exist when a wafer manifests an imaging problem at an X/Y coordinate for which there is a wafer that does not have an imaging problem at that X/Y coordinate. In other words, a wafer defect exists when a wafer manifests an imaging problem that is not common to all the wafers of the lot. (step 50).

Figure 4:
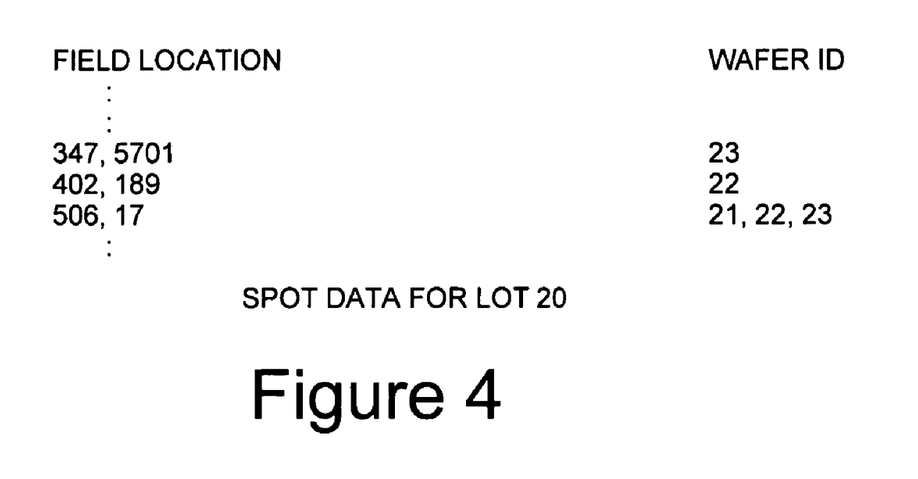
FIG. 4 is a diagram of a data structure generated by the exemplary process.
Figure 5:
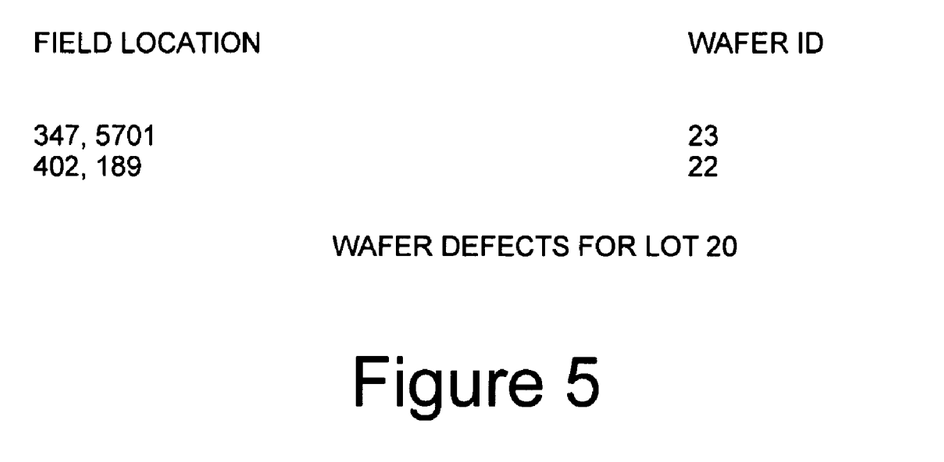
FIG. 5 is a diagram of another data structure generated by the exemplary process.

The data generated by the processing of step 3, shown in FIG. 4, is an input to the processing of step 50. FIG. 5 shows a wafer defect table generated by the processing of step 50.

System 1 updates the chuck defect table. A chuck defect exists when each wafer of the lot manifests an imaging problem at a common X/Y coordinate. (Step 55).

Figure 6:
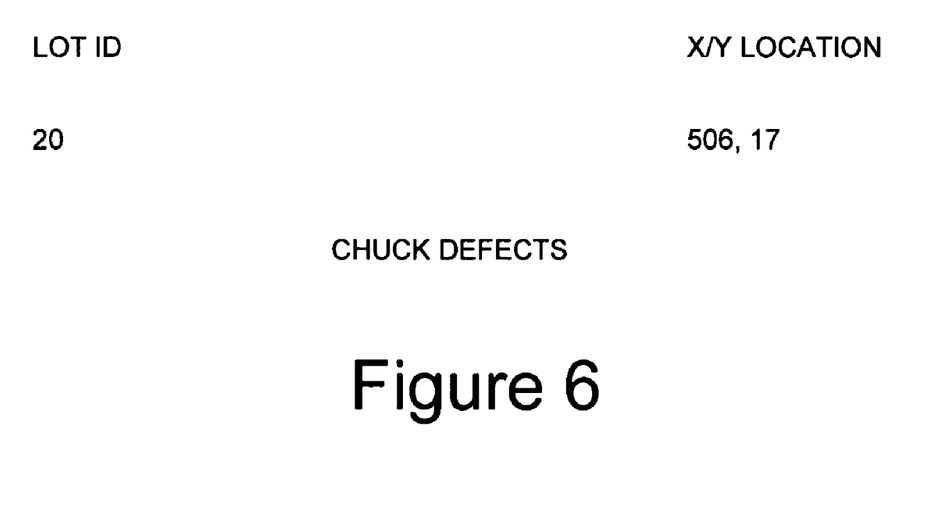
FIG. 6 is a diagram of yet another data structure generated by the exemplary process.

The data generated by the processing of step 3, shown in FIG. 4, is an input to the processing of step 55. FIG. 6 shows a chuck defect table generated by the processing of step 55.

In summary, at a time t1 (FIG. 1) manufacturing step 120 receives wafer lot 20, and generates first image data by placing each wafer of lot 20 on chuck 10, which is a type of platform, and activating camera 205 to receive light (radiation) from the wafer on chuck 10.

At a time t2 step 120 sends some of the wafers back to a previous manufacturing step.

At a time t3 step 120 receives lot 30, containing 21 wafers, including wafers 21, 22, and 23 returning from rework. Step 120 then generates second image data by placing each wafer of lot 30 chuck 10, and activating camera 205.

Circuitry in processor 210 detects whether abnormal first image data exits at a first common location for each of the last 3 wafers of lot 20 placed on chuck 10, excluding any abnormal image data at a location for wafers that previously had abnormal image data at the location. More specifically, the circuitry uses the first image data to generate the spot data of FIG. 4, and then effects step 5 of FIG. 3A.

Circuitry in processor 210 detects whether abnormal second image data exits at a second common location for each of the last 3 wafers of lot 30 placed on chuck 10, excluding any abnormal image data at a location for wafers that previously had abnormal image data at the location. More specifically, the circuitry uses the second image data to generate the spot data of FIG. 7, and effects step 5 of FIG. 3A.

Figure 7:
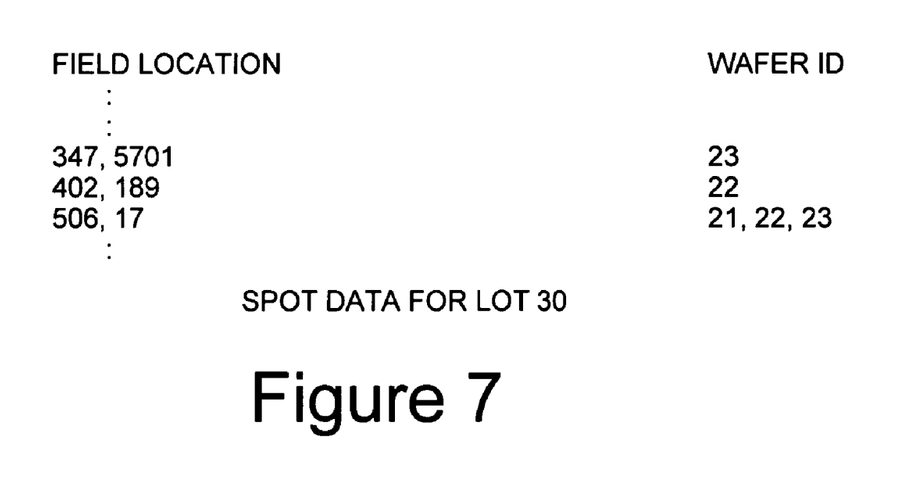
FIG. 7 is a diagram of yet another data structure generated by the exemplary process.

The spot data of FIGS. 4 and 7 is stored in association with the dates and times the data was generated.

Processor 210 signals to a human operator that chuck 10 should be cleaned if, for the two subsequent lots 20 and 30, there is the abnormal condition described in the two previous paragraphs.

At a time t4, wafer 22 is separated out, because it has a repeating defect at the same location, despite having been processed at step 110 multiple times. On the other hand, at a time t5 wafers 21 and 23 are passed to step 130 for subsequent processing.

In this patent application, the word circuitry encompasses dedicated hardware, and/or programmable hardware, such as a central processing unit (CPU) or reconfigurable logic array, in combination with programming data, such as sequentially fetched CPU instructions or programming data for a reconfigurable array. Thus, circuitry encompasses, for example, a general-purpose electronic processor programmed with software, acting to carry out a described function.

Throughout this patent application, certain processing may be depicted in serial, parallel, or other fashion, for ease of description. Actual hardware and software realizations, however, may be varied depending on desired optimizations apparent to one of ordinary skill in the art. For example, the number of chucks in manufacturing step 120 may be only 1, or may be more than 1. The processing described above is applied to a respective chuck receiving a set of wafers belonging to a lot. If step 120 has only 1 chuck, the set of wafers is 100% of the lot, as indicated by the detailed example above. If step 120 has two chucks, the set of wafers may be approximately 50% of the wafers of the lot, etc.

Additional advantages and modifications will readily occur to those skilled in the art. The invention in its broader aspects is therefore not limited to the specific details, representative apparatus, and illustrative examples shown and described. Accordingly, departures may be made from such details without departing from the spirit or the scope of Applicants' general inventive concept. The invention is defined in the following claims. In general, the words "first," "second," etc., employed in the claims do not necessarily denote an order.

What is claimed is:

1. A method comprising:
   receiving a first set of wafers, the first set of wafers being part of a first lot;
   generating first image data by placing each wafer of the first set on a platform and receiving radiation from the wafer on the platform;

receiving a second set of wafers, the second set of wafers being part of a second lot;

generating second image data by placing each wafer of the second set on the platform and receiving radiation from the wafer on the platform;

detecting, using a processor, whether abnormal first image data exists at a first common location for each of the last N wafers of the first set to be placed on the platform, excluding any abnormal image data at a location for wafers that previously had abnormal image data at the location;

detecting, using the processor, whether abnormal second image data exists at a second common location for each of the last N wafers of the second set to be placed on the platform, excluding any abnormal image data at a location for wafers that previously had abnormal image data at the location; and conditionally determining whether to clean the platform, depending on results of the first and second detecting steps.

\* \* \* \* \*